US009792751B2

(12) United States Patent
Ko et al.

(10) Patent No.: US 9,792,751 B2
(45) Date of Patent: Oct. 17, 2017

(54) APPARATUS AND METHOD FOR DISCRIMINATING BILLS USING RF SIGNALS

(71) Applicants: Changho Ko, Gunpo-si (KR); Sang Hwan Jang, Seoul (KR)

(72) Inventors: Changho Ko, Gunpo-si (KR); Sang Hwan Jang, Seoul (KR)

(73) Assignee: Kisan Electronics Co., Ltd., Seoul (KR)

( * ) Notice: Subject to any disclaimer, the term of this patent is extended or adjusted under 35 U.S.C. 154(b) by 136 days.

(21) Appl. No.: 14/959,419

(22) Filed: Dec. 4, 2015

(65) Prior Publication Data

US 2016/0245769 A1 Aug. 25, 2016

(30) Foreign Application Priority Data

Feb. 25, 2015 (KR) ........................ 10-2015-0026783

(51) Int. Cl.
*G01R 27/08* (2006.01)
*G01N 27/04* (2006.01)
(Continued)

(52) U.S. Cl.
CPC ............... *G07D 7/164* (2013.01); *G07D 7/02* (2013.01); *G07D 7/06* (2013.01); *G07D 7/162* (2013.01)

(58) Field of Classification Search
CPC ............ G07D 7/00; G07D 7/004; G07D 7/01; G07D 7/02; G07D 7/06; G07D 7/08; G07D 7/12; G07D 7/16; G07D 7/162; G07D 7/164; G07D 2207/00
USPC ....... 324/600, 629, 633, 635, 637, 642, 644, 324/649, 691, 693, 699, 713, 715, 716, 324/200, 228, 229; 382/100, 135, 137,
(Continued)

(56) References Cited

U.S. PATENT DOCUMENTS 4,429,991 A * 2/1984 Williams ................. G07D 7/12 356/237.1
4,462,587 A * 7/1984 Graef ........................ B65H 7/06 209/534
(Continued)

FOREIGN PATENT DOCUMENTS

AU 696779 B 10/1996
KR 10-2010-0023250 3/2010

OTHER PUBLICATIONS

Sang Hwan Jang and Jong Jib Kim; "Apparatus for Detecting the Bogus Note and Detecting Method of the Same"; Bibliographic Data of KR 10-2010-0023250; Mar. 4, 2010; http://worldwide.espacenet.com.

*Primary Examiner* — Hoai-An D Nguyen
(74) *Attorney, Agent, or Firm* — Andrew D. Fortney; Central California IP Group, P.C.

(57) ABSTRACT

A bill discrimination apparatus and method using a radio frequency (RF) signal that includes a transmission antenna radiating the radio frequency (RF) signal; a reception antenna receiving the RF signal from the transmission antenna; and a control unit providing the RF signal to the transmission antenna, and detecting a thickness of a bill, a state of the bill, or a presence of a foreign object on the bill based on a voltage of the RF signal transmitted through the bill and received by the reception antenna when the bill is between the transmission antenna and the reception antenna. The RF signal has a preset, specific frequency.

20 Claims, 3 Drawing Sheets

(51) Int. Cl.

| | |
|---|---|
| ***G07D 7/164*** | (2016.01) |
| ***G07D 7/162*** | (2016.01) |
| ***G07D 7/02*** | (2016.01) |
| ***G07D 7/06*** | (2006.01) |

(58) Field of Classification Search

USPC ........ 382/138; 194/205, 206, 207, 208, 209, 194/210, 212, 213

See application file for complete search history.

(56) References Cited

U.S. PATENT DOCUMENTS

| | | | | |
|---|---|---|---|---|
| 5,832,104 | A * | 11/1998 | Graves | B65H 3/063 382/135 |
| 6,493,461 | B1 * | 12/2002 | Mennie | G07D 7/162 382/135 |
| 6,548,813 | B1 * | 4/2003 | Fujikawa | B41J 11/002 250/339.01 |
| 6,721,442 | B1 * | 4/2004 | Mennie | G07D 7/162 194/334 |
| 8,432,322 | B2 | 4/2013 | Amm et al. | |
| 8,763,897 | B1 | 7/2014 | Enright et al. | |
| 8,781,420 | B2 | 7/2014 | Schlub et al. | |
| 2007/0057786 | A1 * | 3/2007 | McClure | G01R 33/28 340/551 |
| 2007/0095630 | A1 * | 5/2007 | Mennie | G07D 7/00 194/206 |
| 2008/0153416 | A1 * | 6/2008 | Washiro | H04B 5/00 455/41.1 |
| 2011/0309572 | A1 | 12/2011 | Miyamoto | |
| 2012/0190380 | A1 * | 7/2012 | Dupray | G01S 1/026 455/456.1 |
| 2014/0346007 | A1 | 11/2014 | Enright et al. | |

* cited by examiner

APPARATUS AND METHOD FOR DISCRIMINATING BILLS USING RF SIGNALS

CROSS-REFERENCE TO RELATED APPLICATIONS

This U.S. non-provisional patent application claims priority under 35 U.S.C. §119 to Korean Patent Application No. 10-2015-0026783, filed on Feb. 25, 2015, the entire contents of which are hereby incorporated herein by reference.

BACKGROUND

Field of the Invention

The present disclosure relates to an apparatus and a method for discriminating a bill using a radio frequency (RF) signal, and more particularly, to an apparatus and a method for discriminating a bill that may detect at least one of the thickness and state of the bill and/or the presence of a foreign object on the bill, using the RF signal.

Discussion of the Related Art

Typically, a bill discrimination apparatus is an apparatus for discerning whether an inserted bill is valid or whether it is suitable for distribution. For example, the apparatus may discriminate or determine the fitness of the bill, such as whether the bill is old, new or damaged, or whether it is a counterfeit bill.

The bill discrimination apparatus mentioned in the present disclosure is used as a concept that includes various bill handling apparatuses having bill counting or bill examination functions, as well as a counterfeit bill detection function. The bill discrimination apparatus is used in a financial institution such as a bank, a currency exchange office, or a post office, or in a company or store that handles checks and currency, such as a currency transport company, a gas station, an adult entertainment establishment, a casino, a restaurant, a hotel, a department store, a supermarket, a duty free shop, a big-discount store, and a convenience store.

The bill discrimination apparatus may accurately count the number of bills corresponding to the amount for withdrawal or deposit that is requested by a user, or discern whether the bill is a counterfeit bill, whether there are doubled bills, or whether there is a bill having a foreign object thereon. The bills to be counted may randomly include old bills that are previously issued and used, crumpled bills, folded bills, bills having holes, bills having foreign objects or tape thereon, etc.

New bills have a constant thickness, but old bills may have different thicknesses depending on their state (or condition), and especially in the case of bills to which tape is attached, a region of the bill to which the tape is attached may have a thickness larger than that of an untaped bill.

Thus, a traditional bill discrimination apparatus that detects the state (or condition) or thickness of the bill by an ultrasonic method or by the displacement difference of a transfer roller has limitations in that it is possible to incorrectly discriminate that one old bill is two or more new bills or vice versa, it is difficult to accurately determine a bill to which tape (e.g., a thin tape) is attached, and the manufacturing cost is relatively high. Also, a bill discrimination apparatus that detects the state of a bill using visible light or infrared light has also been proposed, but it has a drawback in that the reliability is low (e.g., errors may occur).

Background art of the present disclosure can be found in Korea Patent Publication No. 10-2006-0060758 (published on Jun. 5, 2006 and entitled "PAPER MONEY THICKNESS MEASUREMENT DEVICE").

SUMMARY

The present disclosure provides an apparatus and a method for discriminating a bill using a radio frequency (RF) signal that may detect at least one of the thickness and/or state of the bill, or the presence of a foreign object on the bill, using the RF signal.

The present disclosure also provides an apparatus for discriminating a bill using the RF signal that may also detect a bill having a security thread printed thereon, a damaged bill such as a torn bill or a bill having a hole, and/or a thick bill due to the attachment of a foreign object or tape, or due to the overlap of two or more bills.

An embodiment of the inventive concept provides a bill discrimination apparatus comprising a transmission antenna radiating a radio frequency (RF) signal; a reception antenna receiving the RF signal from the transmission antenna; a control unit providing the RF signal at a predetermined specific frequency to the transmission antenna and detecting a thickness of the bill, a state of the bill, or the presence of a foreign object on the bill based on a voltage of the RF signal transmitted through the bill and received by the reception antenna when the bill is between the transmission antenna and the reception antenna.

In one or more embodiments of the inventive concept, a bill discrimination method may comprise radiating an RF signal having a predetermined specific frequency and level from a transmission antenna; receiving the RF signal from the transmission antenna at a reception antenna; detecting, by a control unit, a voltage of the RF signal received at the reception antenna, the voltage of the RF signal varying upon insertion of the bill between the transmission antenna and the reception antenna when radiating the RF signal; and determining, by the control unit, a thickness of the inserted bill, a state of the inserted bill, or the presence of a foreign object on the bill, based on the voltage of the RF signal received at the reception antenna.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
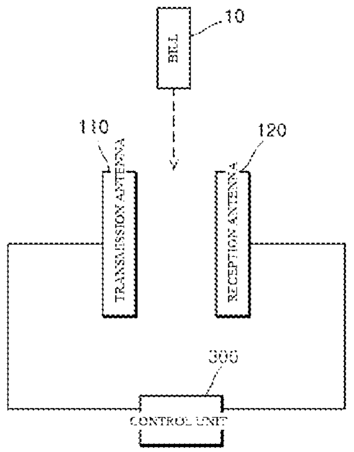
FIG. 1 is a schematic block diagram of a bill discrimination apparatus using a radio frequency (RF) signal according to one or more embodiments of the present disclosure.

In the following, embodiments of an apparatus and a method for discriminating a bill are described with reference to the accompanying drawings. In this process, the thickness of lines or the size of components shown in the drawings may be exaggerated for clarity and convenience of description. Also, the terms to be described are ones defined in consideration of the functions of the present disclosure and may vary depending on the intention of a user or operator, or in practice. Therefore, the definitions of these terms should be based on details throughout the present disclosure.

FIG. 1 is a schematic block diagram of a bill discrimination apparatus using an RF signal according to one or more embodiments of the present disclosure. As shown in FIG. 1, the bill discrimination apparatus includes a transmission antenna 110, a reception antenna 120, and a control unit 300.

The control unit 300 oscillates an RF signal (or provides an oscillating RF signal) having a predetermined frequency (e.g., several MHz to several tens of MHz, or from 1 MHz to 90 MHz, 3 MHz to 50 MHz, or other value or range of values between 1 and 90 MHz). That is, the control unit 300 provides an oscillating RF signal having a predetermined pulse width and period (e.g., a pulse width modulated [PWM] waveform). In this case, it is also possible to amplify the signal to a predetermined output voltage (e.g., several volts to several tens of volts, or from 1 V to 90 V, 3 V to 50 V, or other value or range of values between 1 and 90 V) using an RF transmission signal amplifying unit (not shown) prior to providing the RF signal to the transmission antenna 110. Also, the level of amplification may be adjusted by monitoring and/or changing the gain of the RF transmission signal amplifying unit after evaluation of the received RF signal (or the quality state thereof).

The transmission antenna 110 radiates the RF signal (or amplified RF signal) to and/or through a bill 10 that is being transferred (e.g., through the bill discrimination and/or counting apparatus).

The reception antenna 120 receives the RF signal (e.g., the radiated RF signal) that has been transmitted through the bill 10. In this example, the expression 'transmit' and grammatical variations thereof may technically include the meaning of 'leak' and grammatical variations thereof in the present disclosure.

The control unit 300 detects and analyzes the level (e.g., the voltage level) of the RF signal received by the reception antenna 110.

In this case, since the level of the received RF signal is attenuated to about several mV by the medium (e.g., the air, a paper, a tape, a foreign object, etc.) through which the RF signal is transmitted from the transmission antenna 110 to the reception antenna 120, it is also possible to amplify the attenuated RF signal to a predetermined level (e.g., several volts, or 1-10 V, 3-5 V, or any other value or range of values between 1 and 10 V) using an RF reception signal amplifying unit (not shown) in order to easily use the attenuated RF signal for signal processing (e.g., at a level or voltage that may facilitate or enable discrimination among bills having different qualities).

In this case, the transmission antenna 110 and the reception antenna 120 may include a plurality of channels (e.g., two or more, four or more, eight or more, and in one example, 15 [e.g., CH 1 to CH 15]) according to the width or size of the bill 10, in which case there may be a property difference according to or among an electronic circuit component used for each channel. Thus, the control unit 300 may adjust the gain (e.g., of the transmission signal amplifying unit and/or reception signal amplifying unit) or offset (e.g., of the bill or of the channel) so that the RF signal received by each channel (e.g., CH 1 to CH 15) has the same property for the same medium.

The example of FIG. 1 shows how the control unit 300 performs the oscillation, radiation, and/or reception of the RF signal and also performs amplification and gain and offset adjustment in order to easily process the RF signal. However, it is also possible to decrease the load of the control unit 300 by the configuration of separate components that respectively perform the functions of the control unit 300 according to the practice environment or purpose of a particular implementation.

Figure 2:
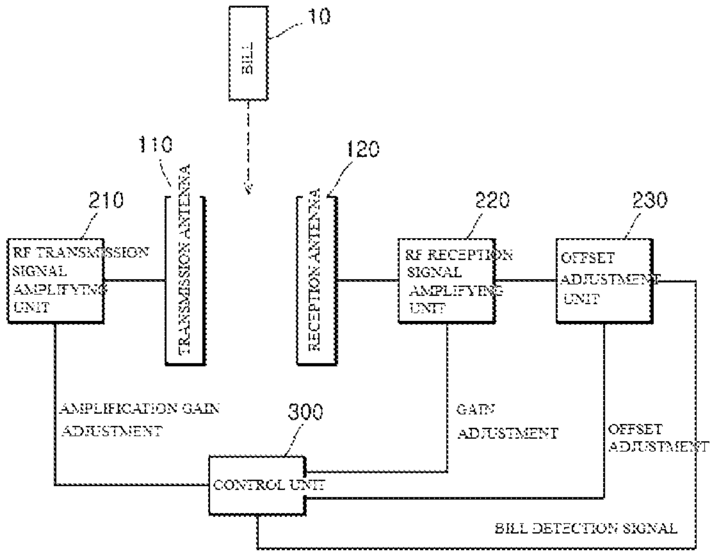
FIG. 2 is a schematic block diagram of a bill discrimination apparatus using an RF signal according to one or more other or further embodiments of the present disclosure.

FIG. 2 is a schematic block diagram of a bill discrimination apparatus using an RF according to one or more other or further embodiments of the present disclosure.

As shown in FIG. 2, the bill discrimination apparatus may include a transmission antenna 110, a reception antenna 120, an RF transmission signal amplifying unit 210, an RF reception signal amplifying unit 220, an offset adjustment unit 230, and a control unit 300.

The control unit 300 oscillates an RF signal or provides an oscillating RF signal having a predetermined frequency (e.g., several MHz to several tens of MHz, or as otherwise described herein). That is, the control unit 300 oscillates an RF signal having a predetermined pulse width and period (e., a PWM waveform). Alternatively, it is also possible to further comprise a separate RF oscillating unit (not shown) that oscillates an RF signal or provides an oscillating RF signal having a predetermined frequency (e.g., several MHz to several tens of MHz, or as otherwise described herein), under the control of the control unit 300.

The RF transmission signal amplifying unit 210 amplifies the RF signal from the control unit 300 (or a separate RF oscillating unit [not shown]) to a predetermined output voltage (e.g., several volts to several tens of volts, or as otherwise described herein).

The transmission antenna 110 radiates the RF signal amplified by the RF transmission signal amplifying unit 210 to and/or through the bill 10 that is being transferred (e.g., through the bill discrimination and/or counting apparatus).

The control unit 300 adjusts the frequency of the RF signal from the control unit 300 or separate RF oscillator (not shown). For example, the control unit 300 or separate RF oscillator provides an oscillating RF signal having a predetermined pulse width and period (e.g., a PWM waveform). In this case, since the output of the RF signal (e.g., the voltage) may be too low for facile discrimination of bills having different qualities or characteristics, the control unit 300 may control amplification of the output level (e.g., a voltage level) of the oscillating RF signal by the RF transmission signal amplifying unit 210. For example, the control unit 300 may control or adjust the gain of the RF transmission signal amplifying unit 210.

Also, the level of amplification may also be adjusted by changing the gain of the RF transmission signal amplifying unit 210 after evaluation of the received RF signal (or the quality state or level thereof). For example, when transmission of the oscillating RF signal starts, the control unit 300 receives an output signal (e.g., an evaluation or feedback signal) for the condition where air is the medium between the transmission and reception antennas 110 and 120 (i.e., there is no bill between the transmission antenna 110 and the reception antenna 120). Thus, it is possible to adjust the gain of the transmission antenna 110 and/or the reception antenna 120 and/or the offset to get an appropriate output (e.g., voltage level of the received RF signal). By using this adjusted condition as reference data (e.g., a reference voltage for comparison purposes), if the acquired data (e.g., voltage of the received RF signal) for the condition where a normal bill or a tape-attached bill passes between the transmission and reception antennas 110 and 120 is higher than the reference data, it is possible to determine that the bill is a normal bill or a bill to which tape has been attached, according to the level (e.g., voltage) of the received RF signal.

The reception antenna 120 receives the RF signal that has been transmitted through the bill 10.

The RF reception signal amplifying unit 220 amplifies the level (e.g., the voltage level) of the RF signal received at the reception antenna 110, according to a predetermined gain. That is, the level of the RF signal is attenuated by the medium through which the RF signal is transmitted. That is, the attenuation level of the RF signal varies according to the medium (e.g., the air, paper, tape, foreign object, etc.) between the transmission antenna 110 and the reception antenna 120. Thus, the attenuated RF signal is amplified to a predetermined level to enable the attenuated RF signal to be more easily processed and used for discrimination (e.g., a voltage level that may enable discrimination among bills having difference qualities and/or characteristics).

The RF reception signal amplifying unit 220 may include a multi-stage amplifier in order to increase an amplification factor. For example, the amplifier may include an operational amplifier (e.g., OP AMP).

The offset adjustment unit 230 adjusts an offset (e.g., of the bill and/or of one or more particular channels) so that the RF signal received by each channel (e.g., CH 1 to CH 15) has the same property for the same medium through which the RF signal is transmitted.

Since the level of the RF signal received at the reception antenna 120 may be too low (e.g., the voltage level of the RF signal, which varies according to the medium through which it is passed, has a value of several mV, as described herein), the control unit 300 controls amplification of the received RF signal to a signal having a value of several volts (or other value as described herein) according to a predetermined amplification gain by the RF reception signal amplifying unit 210.

In this case, the transmission antenna 110 and the reception antenna 120 may include a plurality of channels (e.g., CH 1 to CH 15 or as otherwise described herein) according to the width and/or length of the bill 10, in which case there may be a property difference among various signal transmission channels according to an electronic circuit component (or signal corresponding thereto) for each channel. Thus, the control unit 300 may adjust an offset as described herein using the offset adjustment unit 230 so that the RF signal received by each channel (e.g., CH 1 to CH 15) has the same property for the same medium (e.g., the RF signal in each channel is attenuated to the same ratio for the same medium to have the same reception signal level).

Also, the control unit 300 may control the gain of the RF transmission signal amplifying unit 220 or the offset adjustment in each channel so that the RF signal output by each channel has the same property for the same medium, and control at least one of the RF transmission signal amplifying unit 220, the offset adjustment unit 230 and/or the RF reception signal amplifying unit 230 so that the RF signal transmitted or received by each channel has the same property for the same medium.

The transmission antenna 110 and the reception antenna 120 face each other and are spaced apart from each other at a predetermined and/or certain interval. That is, since they are on opposite sides of the bill 10 with the bill 10 therebetween, it is possible to receive the RF signal transmitted through the bill 100.

However, the present disclosure is not limited thereto, and the reception antenna 120 may be on the same side of the bill 10 as the transmission antenna 110. That is, since the transmission antenna 110 and the reception antenna 120 may have a specific angle of reflection, it is possible to receive the RF signal reflected from the bill 10. Alternatively, it is also possible to discriminate the bill when one reception antenna 120 is on the opposite side of the bill 10 from the transmission antenna 110 and another reception antenna (not shown) is on the same side of the bill 10 as the transmission antenna 110 to measure both transmission and reflection values of the RF signal.

However, the examples in the Figures are described on the assumption that the transmission antenna 110 and the reception antenna 120 face each other, for convenience.

The distance between the transmission antenna 110 and the reception antenna 120 is a distance through which the bill may pass, and the narrower this distance is, the better. For example, the distance d between the transmission antenna 110 and the reception antenna 120 may be from 0.2 mm to 5 mm.

Figure 3:
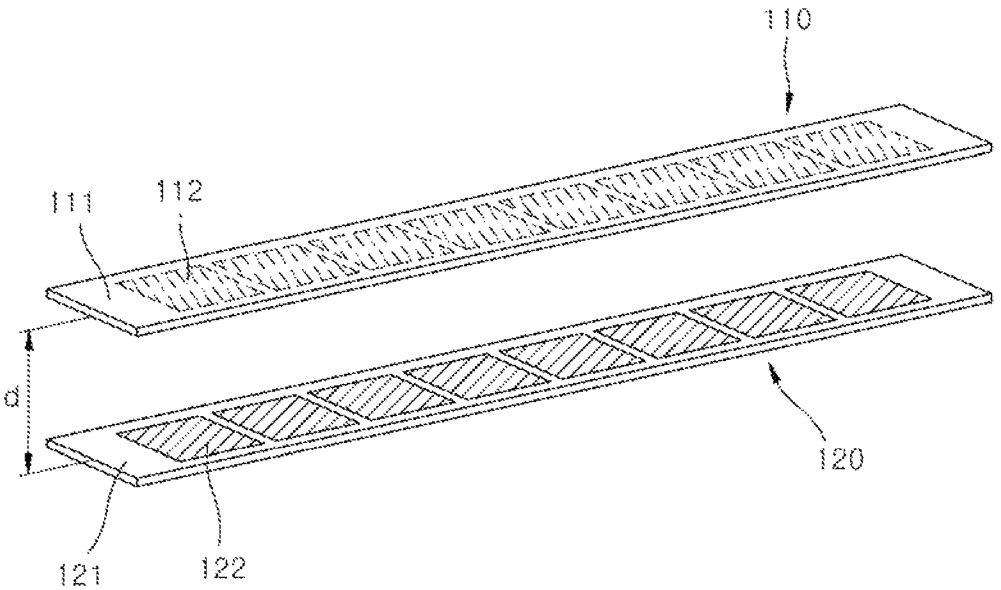
FIG. 3 illustrates an exemplary transmission antenna and an exemplary reception antenna suitable for use in the apparatus of FIG. 1.

FIG. 3 illustrates shapes of the transmission antenna 110 and the reception antenna 120.

In the example of FIG. 3, the transmission antenna 110 may be an antenna module (or array antenna) in which a plurality (e.g., two or more, four or more, eight or more, and in one example, 15 [e.g., CH 1 to CH 15]) of individual antennas 112 are on a circuit board 111. Likewise, the reception antenna 120 may be antenna module (or array antenna) in which a plurality (e.g., two or more, four or more, eight or more, and in one example, 15 [e.g., CH 1 to CH 15]) of individual antennas 122 are on another circuit board 121. Thus, the plurality of individual antennas 112 and 122 in the transmission antenna module 110 and the reception antenna module 120 may each have the same shape (e.g., a rectangle, square, etc.), the same size, and the same number (e.g., 1 to 15, 2 to 8, or any other value of range of values therein). Also, it is noted that the individual antennas 112 and 122 may have various shapes or forms, without limitation, in the form of a flat plane such as that shown in FIG. 3.

In the embodiment(s) described below, the transmission antenna module 110 and the reception antenna module 120 are generally or substantially the same as the transmission antenna 110 and the reception antenna 120 described above, and antennas that are in antenna modules 110 and 120 are referred to as individual antennas 112 and 122, respectively.

The transmission antenna 110 and the reception antenna 120 may have any of a number of variations in size and shape that may increase sensitivity and performance, in accordance with a particular practice and/or environment.

For example, it is possible to form the plurality of individual antennas 112 in the transmission antenna 110 as a square shape, and place or dispose them at uniform intervals. Likewise, it is possible to form the individual antennas 122 of the reception antenna 120 facing the transmission antenna 110 in the same square shape and at the same uniform intervals.

In this case, the number of individual antennas 112 and 122 in the transmission antenna 110 and the reception antenna 120 may be higher or lower than that shown in FIG. 3 (e.g., the individual antennas may correspond to the number of channels [e.g., in a 1:1 relationship] with the plurality of channels). The greater the number of channels, the higher the resolution of the signal, and thus, discrimination is enhanced, but when there are more than a maximum number of channels, there are burdens on signal processing time and throughput. Thus, the number of channels may be appropriately configured according to a particular practice, environment, and/or purpose. It is desirable to have 15 to 20 channels.

Also, it is preferable that the channels of the individual antennas 112 and 122 in the transmission antenna 110 and the reception antenna 120 are the same (e.g., have substantially the same qualities and/or characteristics), if possible, but they are not necessarily the same. For example, it is possible to form each individual antenna 112 in the transmission antenna 110 as one channel or two channels, and it is possible to form a corresponding individual antenna 122 in the reception antenna 120 as 15 channels.

Also, individual antennas (e.g., multi-channel transmission individual antennas and/or reception individual antennas) in the transmission antenna 110 and the reception antenna 120 may be formed at or along one side of the corresponding circuit board 111 or 121 at constant intervals or as an independent module. Also, it is possible to configure the transmission antenna 110 or the reception antenna 120 in the form of an array of rows or rows and columns, in which case it is possible to increase resolution by an alternate configuration.

Static electricity may occur and have an adverse effect on bill discrimination due to the friction between the bill quickly moving on a transfer path (not shown) and the surface of the transfer path or the surfaces of various sensors, and a problem with surface abrasion of the transmission and reception antennas 110 and 120 due to such friction may occur. In order to prevent such problems, it is possible to protect the transmission antenna 110 and the reception antenna 120 with a cover or housing, to coat the surfaces of the transmission antenna 110 and reception antenna 120 with a protective layer, or further install a static electricity removing unit or to use a conductive material for the protective layer or housing to enable the protective layer or housing to remove or eliminate static electricity. Various embodiments related to solving such problems with static electricity may be applied, and for example, it is possible to apply or modify embodiments disclosed in Korean Patent Application No. 10-2014-0038266 and Japanese Patent Nos. 4292015 and/or 3755798 (the relevant contents of each of which are incorporated herein by reference) for removal or elimination of static electricity.

Figure 4:
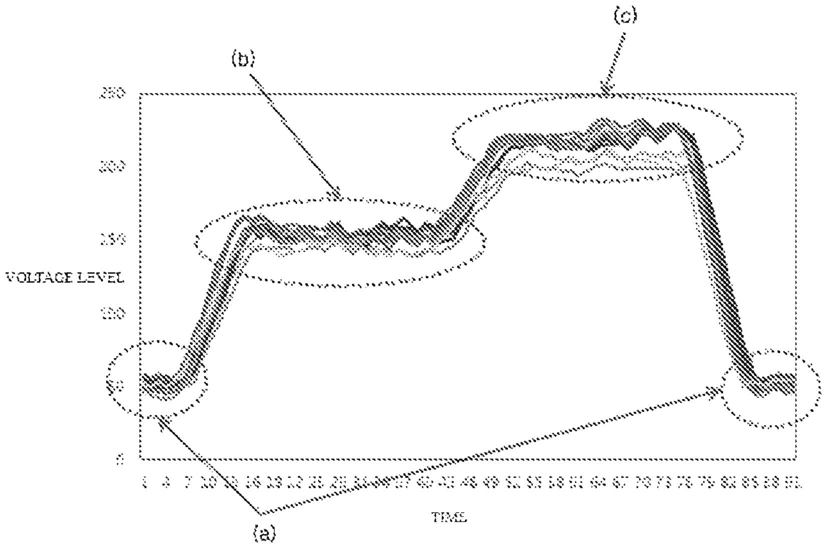
FIG. 4 illustrates detected voltage levels of an RF signal transmitted when a bill is inserted in the apparatus of FIG. 1.

FIG. 4 illustrates detected voltage levels of an RF signal transmitted when a bill is inserted in the apparatus of FIG. 1.

The dashed-line circles (a) in FIG. 4 are waveforms that show the voltage level of an RF signal detected when there is only air between the transmission and reception antennas (i.e., before the bill is inserted between the antennas), the dashed-line circle (b) is a waveform that shows the voltage level of an RF signal detected when bills not including certain error factors (i.e., bills having a normal thickness) are inserted between the antennas, and the dashed-line circle (c) is a waveform that shows the voltage level of an RF signal detected when a foreign object, such as tape, is on the bill between the antennas.

When an RF signal is radiated from the transmission antenna 110, the voltage of the RF signal detected at the reception antenna 120 varies according to the medium through which the RF signal is transmitted.

For example, when there is only air between the transmission antenna 110 and the reception antenna 120, the transmittance of the RF signal (e.g., the voltage of the received RF signal) is low as shown in waveforms (a). When a normal bill 10 is between the transmission antenna 110 and the reception antenna 120, the transmittance of the RF signal or voltage of the received RF signal increases as shown in waveforms (b) relative to air, and when a bill to which tape is attached is between the two antennas 110 and 120, the transmittance of the RF signal further increases relative to a normal bill 10, as shown in waveforms (c). The voltage level and time are in relative, rather than absolute, units of measurement.

Thus, the present disclosure uses a property that the transmittance of the RF signal or voltage of a received RF signal varies according to the type of bill (e.g., the state or thickness of the bill) between the transmission antenna 110 and the reception antenna 120, to detect the thickness, state or condition of the bill 10 and/or the presence of a foreign object on the bill.

For reference, the graph in FIG. 4 shows the level of an RF signal detected in each of a plurality of channels (e.g., CH 1 to CH 15) of the reception antenna 120, and it may be seen that the level of an RF signal detected in each channel shows substantially the same pattern, within a certain and/or acceptable (e.g., relatively small) error range. That is, in the example shown in FIG. 4, the level of the RF signal detected in each channel may be adjusted to have the same pattern and/or value within an acceptable and/or predetermined error range (e.g., the same or substantially the same voltage when an RF signal is transmitted through the same medium) by offset and/or gain adjustment.

In other words, the control unit 300 (or separate RF oscillator, not shown) provides an oscillating square wave of a predetermined frequency as an RF signal and controls the RF transmission signal amplifying unit 210 to amplify the RF signal to a predetermined output level. The amplified signal is radiated from the transmission antenna 110.

Further, when the bill 10 is inserted between the transmission antenna 110 and the reception antenna 120, the RF signal is transmitted through the bill 10 and received by the reception antenna 120. In addition, the RF signal received at the reception antenna 120 may be amplified and optionally enveloped by the RF reception signal amplifying unit 220.

Thus, the control unit 400 may analyze the level (e.g., voltage) of the received and optionally enveloped RF signal to detect the thickness or state of the bill and the presence of a foreign object thereon. For example, the control unit 400 may detect tape, a hologram, or a security thread (or partially exposed security thread) that is attached to the bill 10 by the analysis of the voltage level of the received RF signal. Especially since the hologram or security thread includes a metal component, it is possible to detect such foreign objects in each channel using a property of the RF signal (i.e., it has a low transmittance or a high reflectance).

In addition, the bill discrimination apparatus according to one or more embodiments of the present disclosure may further include a memory (not shown) or database (DB, not shown) for storing one or more levels (e.g., voltages) and/or waveforms corresponding to the thickness or state of a normal bill or a bill having a foreign object thereon, as discrimination reference data, though not shown in the drawings.

Figure 5:
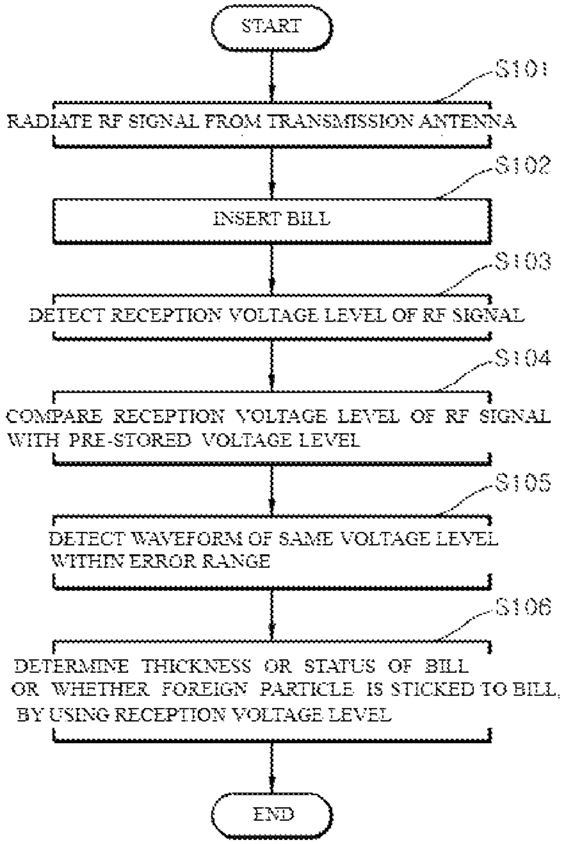
FIG. 5 is a flow chart of an exemplary bill discrimination method using the RF signal according to one or more embodiments of the present disclosure.

FIG. 5 is a flow chart of an exemplary bill discrimination method using an RF signal according to one or more embodiments of the present disclosure.

As shown in FIG. 5, an RF signal having a predetermined specific frequency (e.g., several MHz to several tens of MHz, or as otherwise described herein) and level (e.g., voltage) is radiated from the transmission antenna 110 of a bill discrimination apparatus in step S101.

As described above, when the RF signal having the predetermined specific frequency and level is radiated, the RF signal is transmitted through a medium (e.g., the air, a bill having tape attached thereto, a bill having a security thread and/or hologram printed thereon, etc.) between the transmission antenna 110 and the reception antenna 120. For example, the RF signal may be transmitted through the medium in accordance with the linearity or straightness of the RF signal.

Although the RF signal may be absorbed by or reflected from the medium, embodiments described herein refer to a case where it is transmitted, for convenience.

While the RF signal is radiated from the transmission antenna 110 to the reception antenna 120, the bill 10 is inserted between the transmission antenna 110 and the reception antenna 120 in step S102.

When the bill 10 is inserted between the transmission antenna 110 and the reception antenna 120 as the RF signal is being radiated, the transmittance of the RF signal varies according to the thickness or state of the bill and/or whether a foreign object is on the bill, and there is a difference in the voltage of the RF signal detected in the reception antenna 120.

Thus, the control unit 300 detects the voltage of the received RF signal (e.g., the reception voltage level) that varies when the bill 10 is inserted in step S103.

In order to detect the voltage of the received RF signal, the RF signal may be amplified by a predetermined gain and optionally enveloped.

In this case, it is assumed that the voltage (or voltage waveform) data of the received RF signal in accordance with or corresponding to the thickness or state of the bill and with one or more foreign objects on the bill are pre-stored in an internal memory or DB (not shown) as reference data for discrimination among various bills or bill types.

Next, the control unit 300 compares the detected voltage of the received RF signal with the reference voltage or waveform data that are pre-stored in the internal memory (not shown) in step S104, and detects or determines the reference data or waveform that is the same or most similar to the voltage of the received RF signal within an acceptable error range (e.g., a predetermined maximum error) in step S105.

In sequence, the control unit 300 uses the compared and detected voltage to determine the thickness or state of the inserted bill or the presence of a foreign object on the bill in step S106. In a further embodiment, the control unit 300 may determine the nature of the foreign object (e.g., tape, a security thread, and/or a hologram) on the bill by comparing the voltage of the received RF signal with reference voltage or waveform data corresponding to bills having such foreign object(s) thereon.

Although embodiments have been described with regard to a method of determining the thickness or state of the bill and/or the presence of a foreign object on the bill using transmittance of the RF signal through the bill, it is also possible to use the reflection of the RF signal or both the transmission and the reflection of the RF signal together to determine the thickness or state of the bill or presence of a foreign object on the bill.

The bill discrimination apparatus according to various embodiments may be used solely or alone, but it is also possible to use the apparatus to supplement the function(s) of a typical bill discrimination, sorting and/or counting apparatus.

Since the present apparatus and method may detect the thickness or state of a bill and/or the presence of a foreign object on the bill using an RF signal, it is possible to decrease the manufacturing cost of the bill discrimination apparatus, and since the present apparatus and method may also detect a bill having a security thread and/or hologram printed thereon, a damaged bill such as a torn bill or a bill having a hole therein, and a thick bill due to the attachment of a foreign object or tape thereon or due to the overlap of two or more bills, it is possible to enhance the accuracy of bill discrimination.

Although the present disclosure has been made with reference to embodiments shown in the accompanying drawings, they are only exemplary, and a person skilled in the art would understand that it is possible to derive various modifications and other equivalent embodiments therefrom. Thus, the technical protective scope of the present disclosure should be defined by the following claims.

What is claimed is:

1. A bill discrimination apparatus comprising:

a transmission antenna radiating a radio frequency (RF) signal having a predetermined specific frequency;

a reception antenna receiving the RF signal that from the transmission antenna;

a control unit providing the RF signal to the transmission antenna, and detecting a thickness of a bill, a state of the bill or a presence of a foreign object on the bill based on a voltage of the RF signal transmitted through the bill and received by the reception antenna when the bill is between the transmission antenna and the reception antenna.

2. The bill discrimination apparatus of claim 1, further comprising an RF transmission signal amplifying unit that amplifies the RF signal from the control unit to a predetermined level and provides the amplified RF signal to the transmission antenna.

3. The bill discrimination apparatus of claim 1, wherein the control unit comprises an RF oscillating unit that provides the RF signal to the transmission antenna.

4. The bill discrimination apparatus of claim 1, further comprising an RF reception signal amplifying unit that amplifies the RF signal received by the reception antenna to a predetermined level.

5. The bill discrimination apparatus of claim 4, wherein the control unit controls amplification by the RF reception signal amplifying unit of the RF signal received by the reception antenna.

6. The bill discrimination apparatus of claim 1, further comprising an offset adjustment unit that adjusts an offset of the bill and enables the RF signal received by the reception antenna to have a same property for a same medium through which the RF signal is transmitted.

7. The bill discrimination apparatus of claim 6, wherein the RF signal radiated from the transmission antenna and received by the reception antenna has a plurality of channels and the same property for the same medium in each of the plurality of channels.

8. The bill discrimination apparatus of claim 1, wherein the RF signal radiated from the transmission antenna has a frequency of from 1 MHz to 90 MHz and an output level of from 1 volt to 90 volts.

9. The bill discrimination apparatus of claim 1, wherein each of the transmission antenna and the reception antenna comprises a module antenna or an array antenna.

10. The bill discrimination apparatus of claim 9, further comprising a circuit board, wherein the transmission antenna comprises a multi-channel transmission antenna on the circuit board having a plurality of channels spaced at a predetermined interval, and the reception antenna comprises a multi-channel reception individual antenna on the circuit board having a plurality of channels spaced at a same or different predetermined interval.

11. The bill discrimination apparatus of claim 10, wherein each of the transmission antenna and the reception antenna is flat or planar and has one or more square shapes.

12. The bill discrimination apparatus of claim 1, wherein the transmission antenna and the reception antenna face each other and are spaced apart from each other at a distance of 0.2 mm to 5 mm.

13. The bill discrimination apparatus of claim 1, wherein the voltage of the RF signal received by the reception antenna varies according to a medium through which the RF signal is transmitted, the voltage of the RF signal received by the reception antenna has a first value when the medium is air, a second value when the medium is a bill, and a third value when the medium is a bill having tape thereon, and the first value is less than the second value, and the second value is less than the third value.

14. The bill discrimination apparatus of claim 13, wherein the control unit detects the thickness of the bill or the state of the bill when the voltage of the RF signal received by the reception antenna has the second value, and the presence of the foreign object on the bill when the voltage of the RF signal received by the reception antenna has the third value.

15. A bill discrimination method comprising:

radiating an RF signal having a predetermined specific frequency and level from a transmission antenna;

receiving the RF signal from the transmission antenna at a reception antenna;

detecting, by a control unit, a voltage of the RF signal received at the reception antenna, the voltage of the RF signal received at the reception antenna varying upon insertion of a bill between the transmission antenna and the reception antenna when radiating the RF signal; and determining, by the control unit, a thickness of the inserted bill, a state of the inserted bill, or a presence of a foreign object on the bill, based on the voltage of the RF signal received at the reception antenna.

16. The bill discrimination method of claim 15, further comprising, before the radiating the RF signal:

oscillating the RF signal at a specific frequency using the control unit or an RF oscillating unit; and amplifying the RF signal to a predetermined level using an RF transmission signal amplifying unit.

17. The bill discrimination method of claim 15, further comprising, after receiving the RF signal at the reception antenna, amplifying the RF signal received at the reception antenna to a predetermined level using an RF reception signal amplifying unit.

18. The bill discrimination method of claim 15, further comprising adjusting an offset of the bill using an offset adjustment unit to enable the RF signal received by the reception antenna to have a same property for a same medium through which the RF signal is transmitted.

19. The bill discrimination method of claim 15, wherein the voltage of the RF signal received at the reception antenna varies according to a medium through which the RF signal is transmitted, and the voltage of the RF signal received by the reception antenna has a first value when the medium is air, a second value when the medium is a bill, and a third value when the medium is a bill having tape thereon, and the first value is less than the second value, and the second value is less than the third value.

20. The bill discrimination method of claim 19, wherein the control unit detects the thickness of the bill or the state of the bill when the RF signal received at the reception antenna has the second value, and the presence of the foreign object on the bill when the voltage of the RF signal received at the reception antenna has the third value.

* * * * *